(12) United States Patent
Sakamoto et al.

(10) Patent No.: US 11,525,859 B2
(45) Date of Patent: Dec. 13, 2022

(54) INSERTION/EXTRACTION MECHANISM AND METHOD FOR REPLACING BLOCK MEMBER

(71) Applicant: Tokyo Electron Limited, Tokyo (JP)

(72) Inventors: Hiroaki Sakamoto, Yamanashi (JP); Masanori Ueda, Yamanashi (JP); Jun Fujihara, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 430 days.

(21) Appl. No.: 16/682,915

(22) Filed: Nov. 13, 2019

(65) Prior Publication Data

US 2020/0153189 A1    May 14, 2020

(30) Foreign Application Priority Data

Nov. 14, 2018 (JP) .............................. JP2018-214146

(51) Int. Cl.
| | |
|---|---|
| *G01R 31/28* | (2006.01) |
| *H01R 43/26* | (2006.01) |
| *H01R 13/631* | (2006.01) |
| *H01L 21/67* | (2006.01) |
| *H01R 13/24* | (2006.01) |
| *G01R 1/073* | (2006.01) |

(52) U.S. Cl.
CPC ..... *G01R 31/2889* (2013.01); *G01R 31/2886* (2013.01); *H01L 21/67242* (2013.01); *H01R 13/24* (2013.01); *H01R 13/631* (2013.01); *H01R 43/26* (2013.01); *G01R 1/07342* (2013.01)

(58) Field of Classification Search
CPC . G01R 31/2886; G01R 31/2889; H01R 43/26
See application file for complete search history.

(56) References Cited

FOREIGN PATENT DOCUMENTS

| CN | 107053138 A | 8/2017 |
|---|---|---|
| CN | 108028211 A | 5/2018 |
| JP | H07-35777 A | 2/1995 |
| JP | H11-111791 A | 4/1999 |
| JP | 2015-61021 A | 3/2015 |

*Primary Examiner* — Livius R. Cazan
(74) *Attorney, Agent, or Firm* — Fenwick & West LLP

(57) ABSTRACT

There is provided an insertion/extraction mechanism for having one or multiple block members being inserted into or extracted from a frame member forming an intermediate connection member that is disposed between a first member having multiple first members and a second member having multiple second terminals and electrically connects the first terminals and the second terminals, the block member having multiple connection terminals for electrically connecting the first terminals and the second terminals. The insertion/extraction mechanism comprises a first engaging unit and a second engaging unit that are engaged with a first engaged portion and a second engaged portion of the block member, respectively, thereby holding the block member.

17 Claims, 12 Drawing Sheets

INSERTION/EXTRACTION MECHANISM AND METHOD FOR REPLACING BLOCK MEMBER

CROSS-REFERENCE TO RELATED APPLICATIONS

This application claims priority to Japanese Patent Application No. 2018-214146, filed on Nov. 14, 2018, which is incorporated by reference in its entirety.

TECHNICAL FIELD

The present disclosure relates to an insertion/extraction mechanism and a method for replacing a block member.

BACKGROUND

In a semiconductor device manufacturing process, electrical characteristics of a plurality of devices formed on a substrate are inspected by an inspection apparatus. The inspection apparatus includes a prober to which a probe card having probes to be in contact with the devices formed on the substrate is disposed, a tester for inspecting various electrical characteristics of the devices by applying electrical signals to the devices via the probe card, and the like.

In this inspection apparatus, an intermediate connection member is provided to electrically connect the tester and the probe card. As the intermediate connection member, there is known one including multiple pogo blocks having a plurality of pogo pins, and a pogo frame having multiple insertion holes into which the pogo blocks are inserted.

The present disclosure provides a technique capable of attaching/detaching a block member having a connection terminal within a short period of time without contaminating the connection terminal.

SUMMARY

In accordance with an aspect of the present disclosure, there is provided an insertion/extraction mechanism for having one or multiple block members being inserted into or extracted from a frame member forming an intermediate connection member that is disposed between a first member having multiple first members and a second member having multiple second terminals and electrically connects the first terminals and the second terminals, the block member having multiple connection terminals for electrically connecting the first terminals and the second terminals. The insertion/extraction mechanism comprises: a first engaging unit that is engageable with a first engaged portion of the block member and is movable at least between a position where the first engaging unit is engaged with the first engaged portion and a position where the first engaging unit is not engaged with the first engaged portion; and a second engaging unit that is engageable with a second engaged portion of the block member and is movable at least between a position where the second engaging unit is engaged with the second engaged portion and a position where the second engaging unit is not engaged with the second engaged portion. The first engaging unit and the second engaging unit may be engaged with the first engaged portion and the second engaged portion, respectively, thereby holding the block member.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
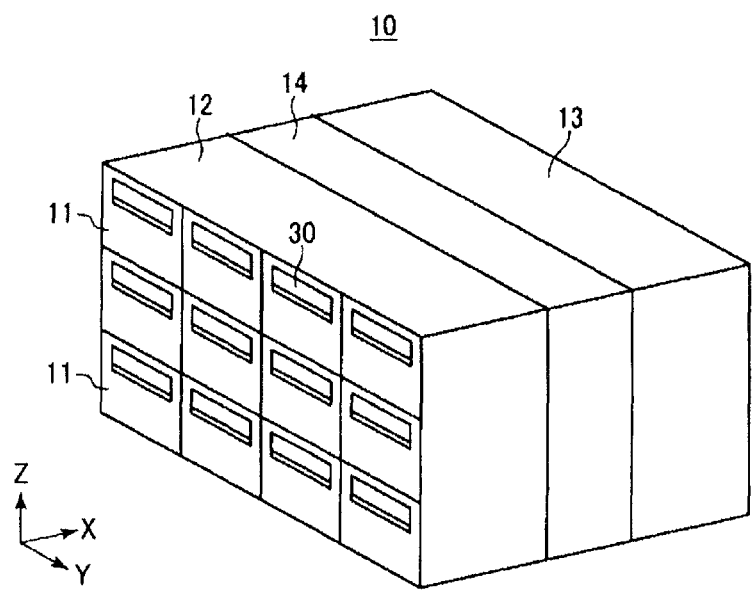
FIG. 1 is a perspective view showing a configuration example of an inspection system including a plurality of inspection apparatuses according to one embodiment.

Hereinafter, embodiments will be described in detail with reference to the accompanying drawings. Like reference numerals will be given to like or corresponding parts throughout the drawings, and redundant description thereof will be omitted.

(Inspection System)

FIG. 1 is a perspective view showing a configuration example of an inspection system including a plurality of inspection apparatuses. An inspection system 10 inspects various electrical characteristics of devices under tests (DUTs) formed on a semiconductor wafer (hereinafter, referred to as "wafer") as an inspection target by applying electrical signals to the DUTs.

The inspection system 10 is formed in a rectangular parallelepiped shape, and includes an inspection unit 12 having a plurality of inspection chambers 11 and a loader unit 13 for loading/unloading a wafer W into/from each inspection chamber 11. In the inspection unit 12, four inspection chambers 11 are horizontally arranged to form one row, and there are three rows vertically. A transfer unit 14 is disposed between the inspection unit 12 and the loader unit 13. A transfer mechanism (not shown) is disposed in the transfer unit 14 to transfer the wafer W between the loader unit 13 and each inspection chamber 11. An inspection apparatus to be described later is disposed in each inspection chamber 11. A tester 30 constituting the inspection apparatus is inserted into each inspection chamber 11 from a front surface of the inspection unit 12. In FIG. 1, the inward direction of the inspection chambers 11 is set to the X direction; the arrangement direction of the inspection chambers 11 is set to the Y direction; and the height direction of the inspection chambers 11 is set to the Z direction.

Figure 2:
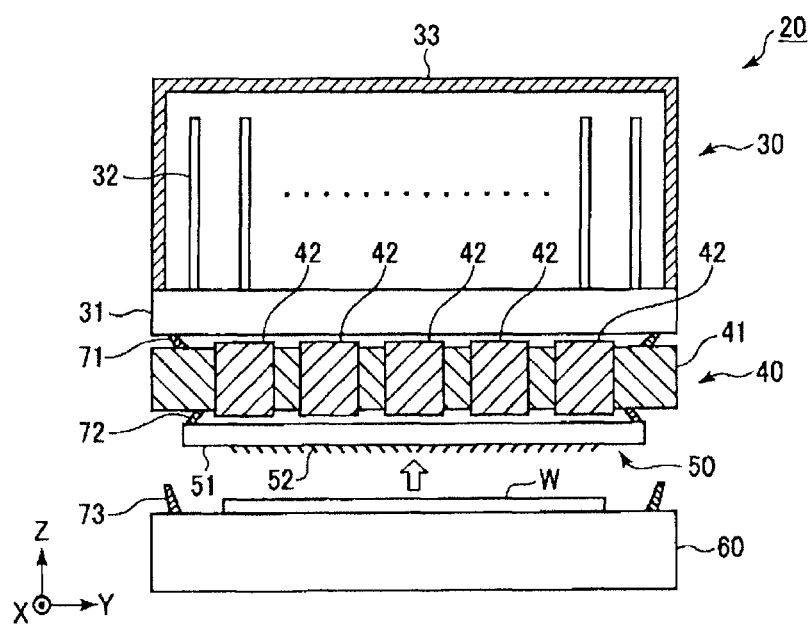
FIG. 2 is a cross-sectional view showing an inspection apparatus of the inspection system shown in FIG. 1 according to one embodiment.

FIG. 2 is a cross-sectional view showing an inspection apparatus of the inspection system 10 of FIG. 1. The inspection apparatus 20 includes a tester 30, an intermediate connection member 40, and a probe card 50. In the inspection apparatus 20, electrical characteristics of DUTs formed on the wafer W are inspected by the tester 30 through the probe card 50.

The tester 30 includes a tester motherboard 31 disposed horizontally, a plurality of test circuit boards 32 mounted upright in slots of the tester motherboard 31, a housing 33 accommodating the test circuit boards 32. A plurality of terminals (not shown) is disposed on a bottom portion of the tester motherboard 31.

The probe card 50 includes a plate-shaped base 51 having a plurality of terminals (not shown) on an upper surface thereof, and a plurality of probes 52 disposed on a bottom surface of the base 51. The probes 52 are brought into contact with the DUTs formed on the wafer W. The wafer W is aligned by an aligner (not shown) while being attracted to a stage 60, and the probes are brought into contact with the DUTs corresponding thereto.

The intermediate connection member 40 that electrically connects the tester 30 and the probe card 50 includes a pogo frame 41 and pogo blocks 42.

Figure 3:
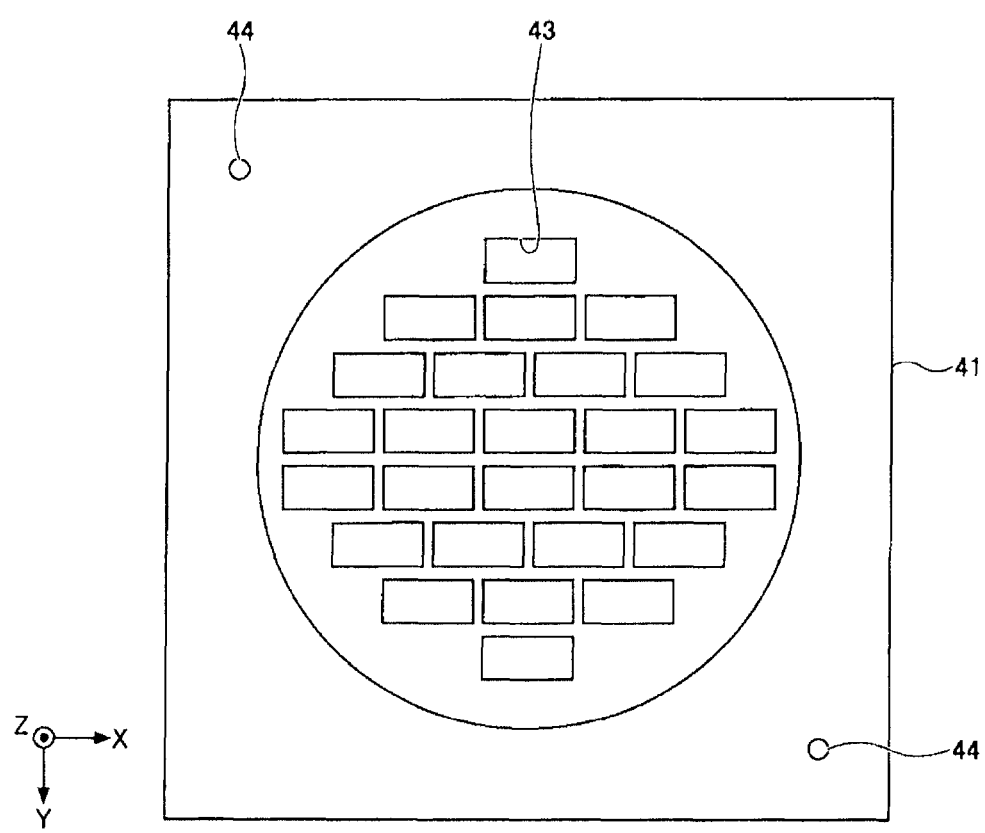
FIG. 3 is a plan view showing a pogo frame of an intermediate connection member in the inspection apparatus shown in FIG. 2 according to one embodiment.

The pogo frame 41 is made of a material, e.g., a NiFe alloy, having a high strength, a high rigidity, and a low thermal expansion coefficient. For example, as shown in FIG. 3, the pogo frame 41 is formed in a rectangular shape and has a plurality of rectangular insertion holes 43 penetrating therethrough in a thickness direction (i.e., the Z direction). The pogo blocks 42 are inserted into the insertion holes 43. Positioning holes 44 are formed on the upper surface of the pogo frame 41 to correspond to positioning pins 113 of an insertion/extraction mechanism 100 to be described later. The positioning pins 113 are inserted into the positioning holes 44. In FIG. 3, the positioning holes 44 are disposed at diagonal positions on the upper surface of the pogo frame 41 with respect to a region where the insertion holes 43 are formed. FIG. 3 is a plan view showing the pogo frame 41 of the intermediate connection member 40 in the inspection apparatus 20 of FIG. 2.

The pogo blocks 42 are positioned with respect to the pogo frame 41. The pogo blocks 42 connect the terminals of the tester motherboard 31 in the tester 30 and the terminals of the base 51 in the probe card 50. The pogo blocks 42 will be described later in detail.

A sealing member 71 is disposed between the tester motherboard 31 and the pogo frame 41. By evacuating the space between the tester motherboard 31 and the intermediate connection member 40, the intermediate connection member 40 is attracted to the tester motherboard 31 via the sealing member 71. A sealing member 72 is disposed between the pogo frame 41 and the probe card 50. By evacuating the space between the intermediate connection member 40 and the probe card 50, the probe card is attracted to the intermediate connection member 40 via the sealing member 72.

A sealing member 73 is disposed on the upper surface of the stage 60 to surround the wafer W. The stage 60 is lifted by an aligner (not shown) disposed at each side and the probes 52 of the probe card 50 are brought into contact with the electrodes of the DUTs formed on the wafer W. Further, the stage 60 is attracted to the intermediate connection member 40 by bringing the sealing member 73 into contact with the pogo frame 41 and evacuating the space surrounded by the sealing member 73.

Figure 4:
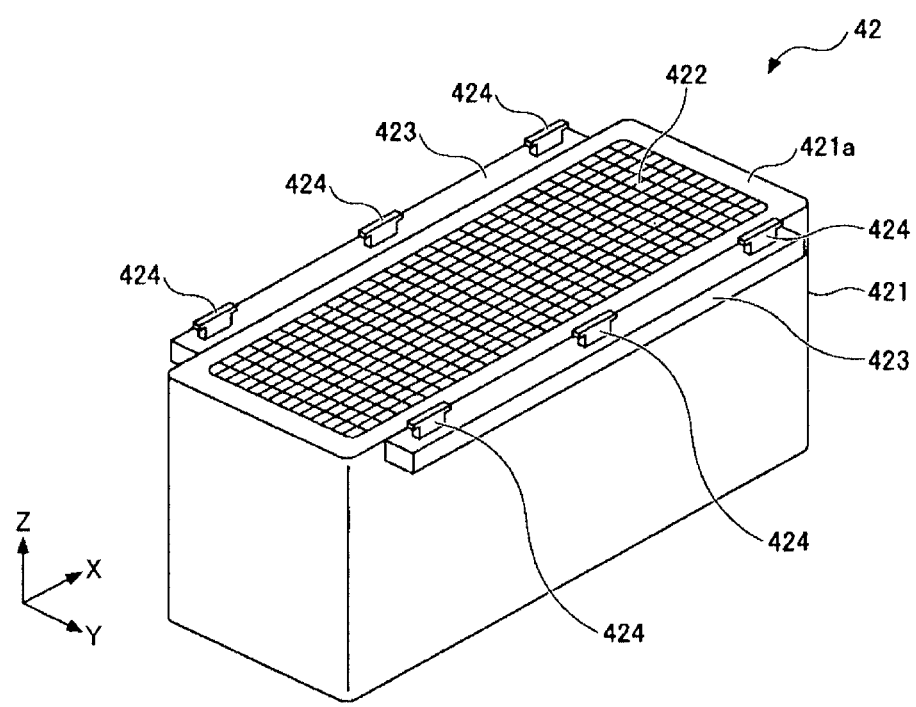
FIG. 4 is a perspective view showing an example of a pogo block according to one embodiment.
Figure 5:
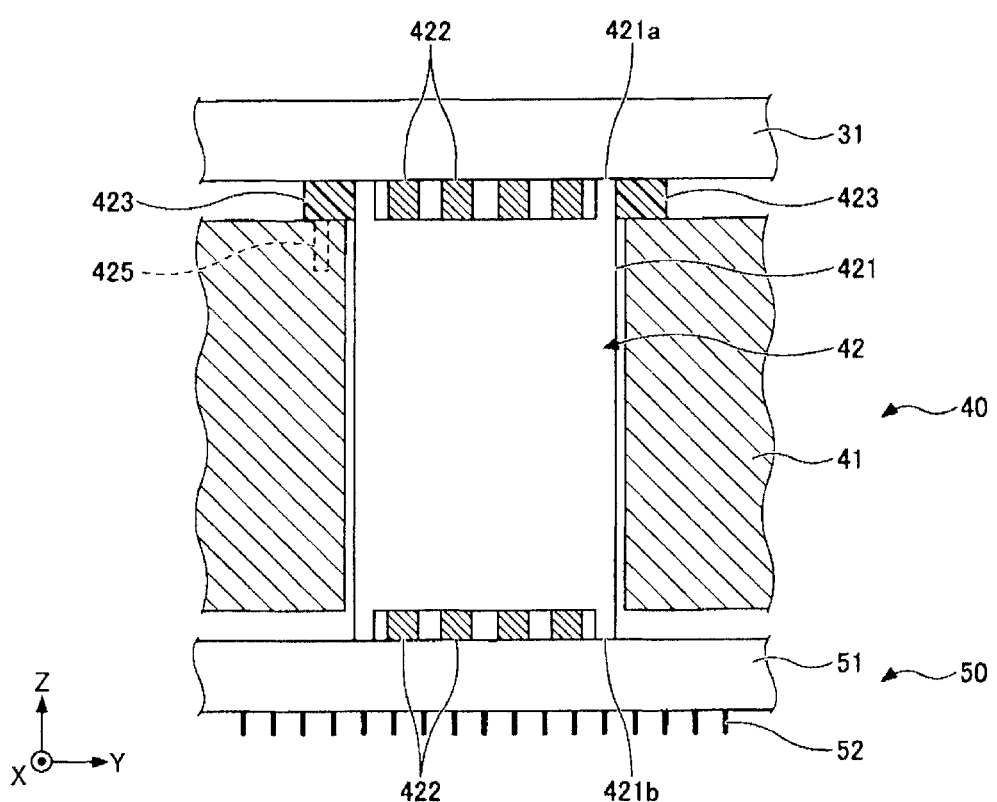
FIG. 5 is a cross-sectional view showing a state in which the pogo block of FIG. 4 is inserted into the pogo frame according to one embodiment.

Hereinafter, the intermediate connection member 40, particularly the pogo block 42, will be described in detail. FIG. 4 is a perspective view showing an example of the pogo block 42. FIG. 5 is a cross-sectional view showing a state in which the pogo block 42 of FIG. 4 is inserted into the pogo frame 41.

The pogo block 42 includes a guide member 421, a connection terminal 422, flanges 423, and pin locking portions 424.

The guide member 421 is formed in a substantially rectangular parallelepiped shape having long sides and short sides in the plan view. The direction parallel to the long sides is set to the X direction, and the direction parallel to the short sides is set to the Y direction. The long sides have a length of, e.g., 50 mm or more, and the short sides have a length of, e.g., 20 mm or more. A frame 421a is formed along an outer edge of an upper end of the guide member 421, and a plurality of connection terminals 422 are disposed in a space surrounded by the frame 421a. A frame 421b is formed along an outer edge of a lower end of the guide member 421, and a plurality of connection terminals 422 are disposed in a space surrounded by the frame 421b. The connection terminals 422 disposed in the space surrounded by the frame 421a and the connection terminals 422 disposed in the space surrounded by the frame 421b are connected to one ends and the other end of connection pins (not shown) disposed in the guide member 421, respectively.

By evacuating the space between the tester motherboard 31 and the intermediate connection member 40 and the space between the intermediate connection member 40 and the base 51 of the probe card 50, the terminals of the tester motherboard 31 and the terminals of the base 51 are connected with the connection terminals 422. At this time, the tester motherboard 31 is in contact with the frame 421a, and the base 51 is in contact with the frame 421b.

The flanges 423 are made of resin and protrude outward from the long sides of the guide member 421.

The pin locking portions 424 are formed on the upper surface of the flanges 423. First engaging pins 121 and 221 and second engaging pins 131 and 231 of the insertion/extraction mechanism 100 to be described later are locked to the pin locking portions 424. Three pin locking portions 424 are disposed at each flange 423.

Figure 6:
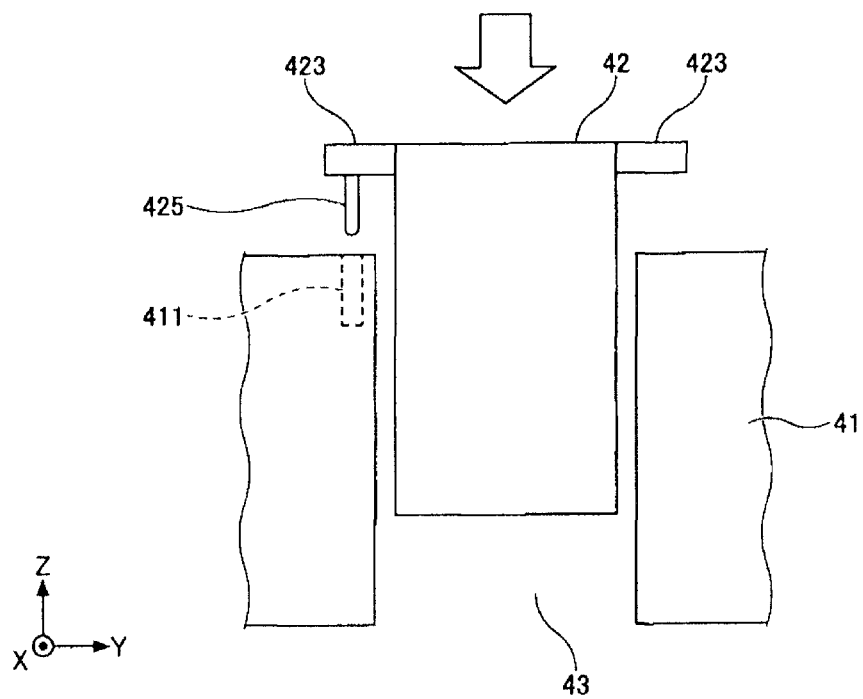
FIG. 6 shows a state in which the pogo block of FIG. 4 is being inserted into the insertion hole of the pogo frame according to one embodiment.

FIG. 6 showing a state in which the pogo block 42 is being inserted into the insertion hole 43 of the pogo frame 41. As shown in FIG. 6, the pogo block 42 is inserted from the upper portion of the insertion hole 43 of the pogo frame 41, and the flanges 423 are locked to the upper surface of the pogo frame 41. A positioning pin 425 is disposed on a bottom surface of one flange 423 to protrude downward. In other words, the positioning pin 425 is disposed in a region different from a region where the connection pins of the pogo block 42 are disposed. The positioning pin 425 is inserted into a positioning hole 411 disposed on the upper surface of the pogo frame 41 to correspond to the positioning pin 425. Accordingly, the pogo block 42 is positioned with respect to the pogo frame 41.

(Insertion/Extraction Mechanism)

Figure 7:
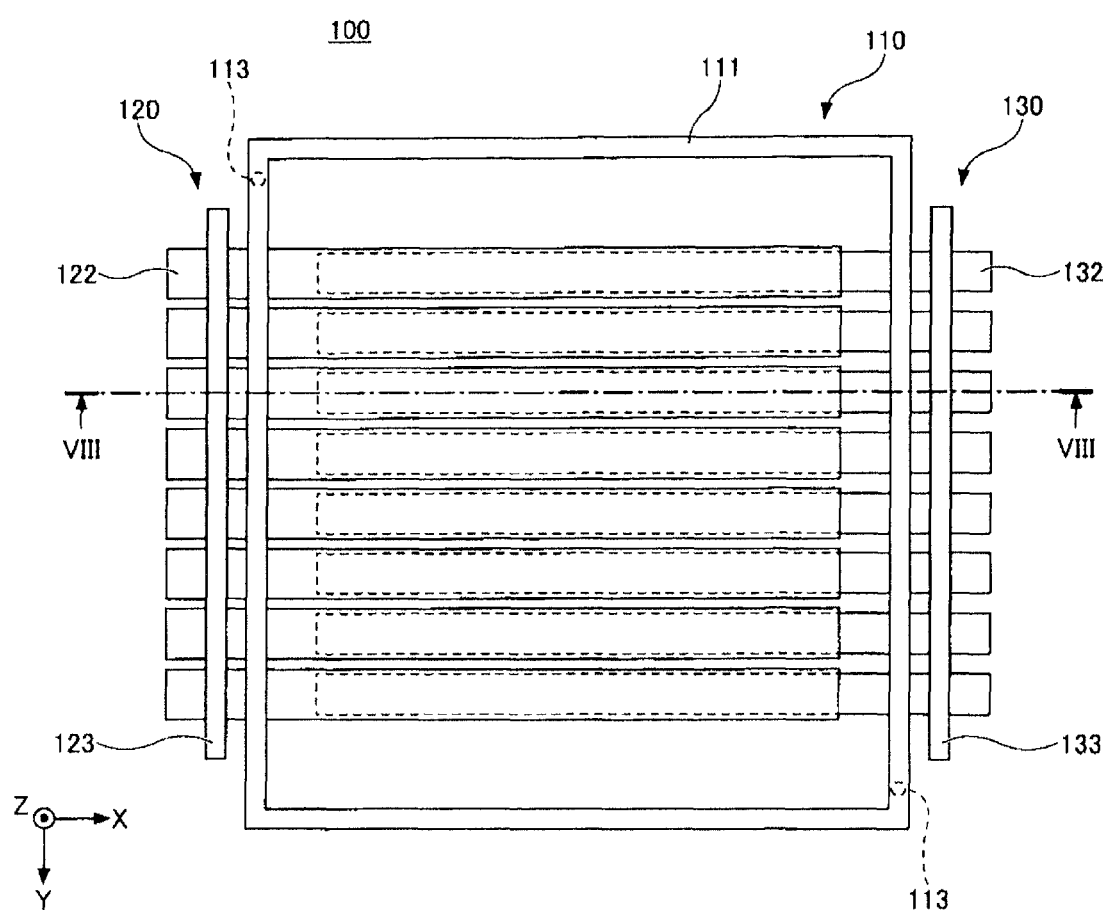
FIG. 7 is a plan view showing an example of an insertion/extraction mechanism according to one embodiment.
Figure 8:
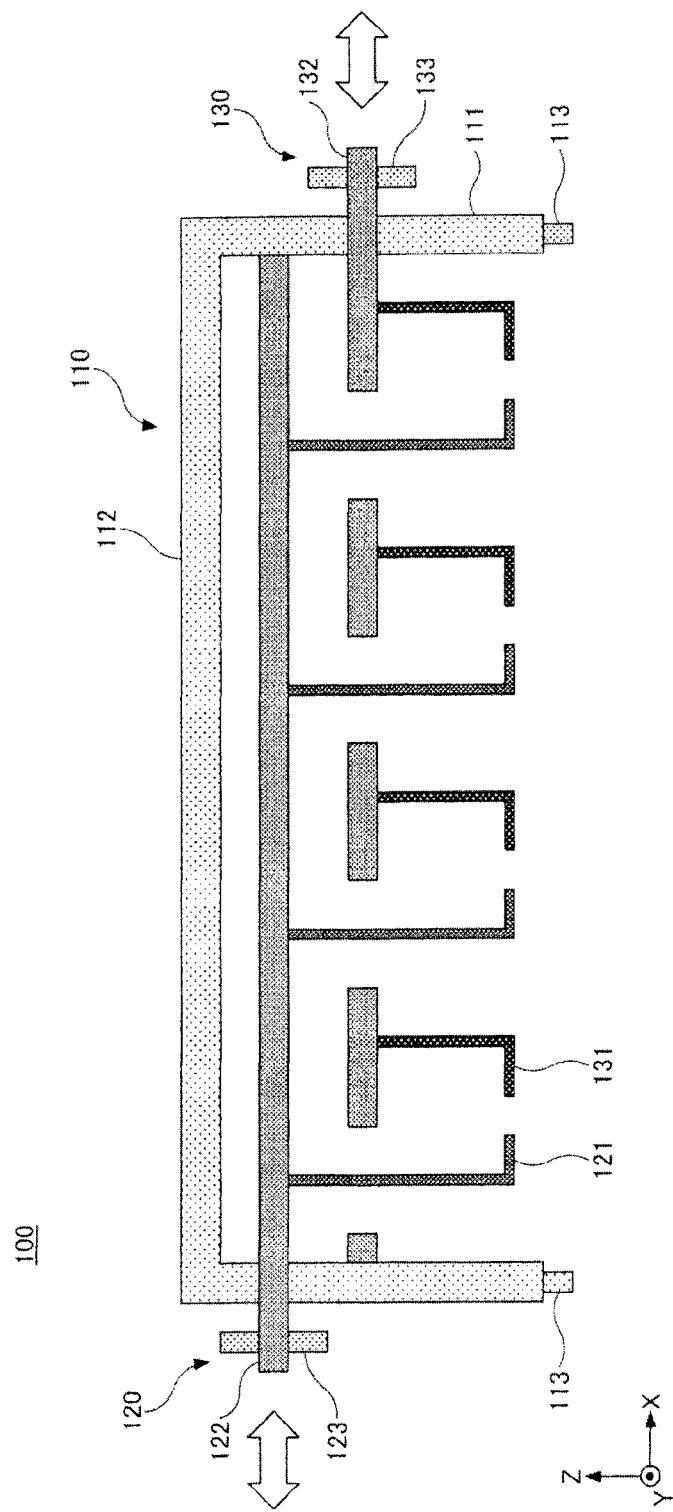
FIG. 8 is a cross-sectional view of the insertion/extraction mechanism of FIG. 7 according to one embodiment.
Figure 9:
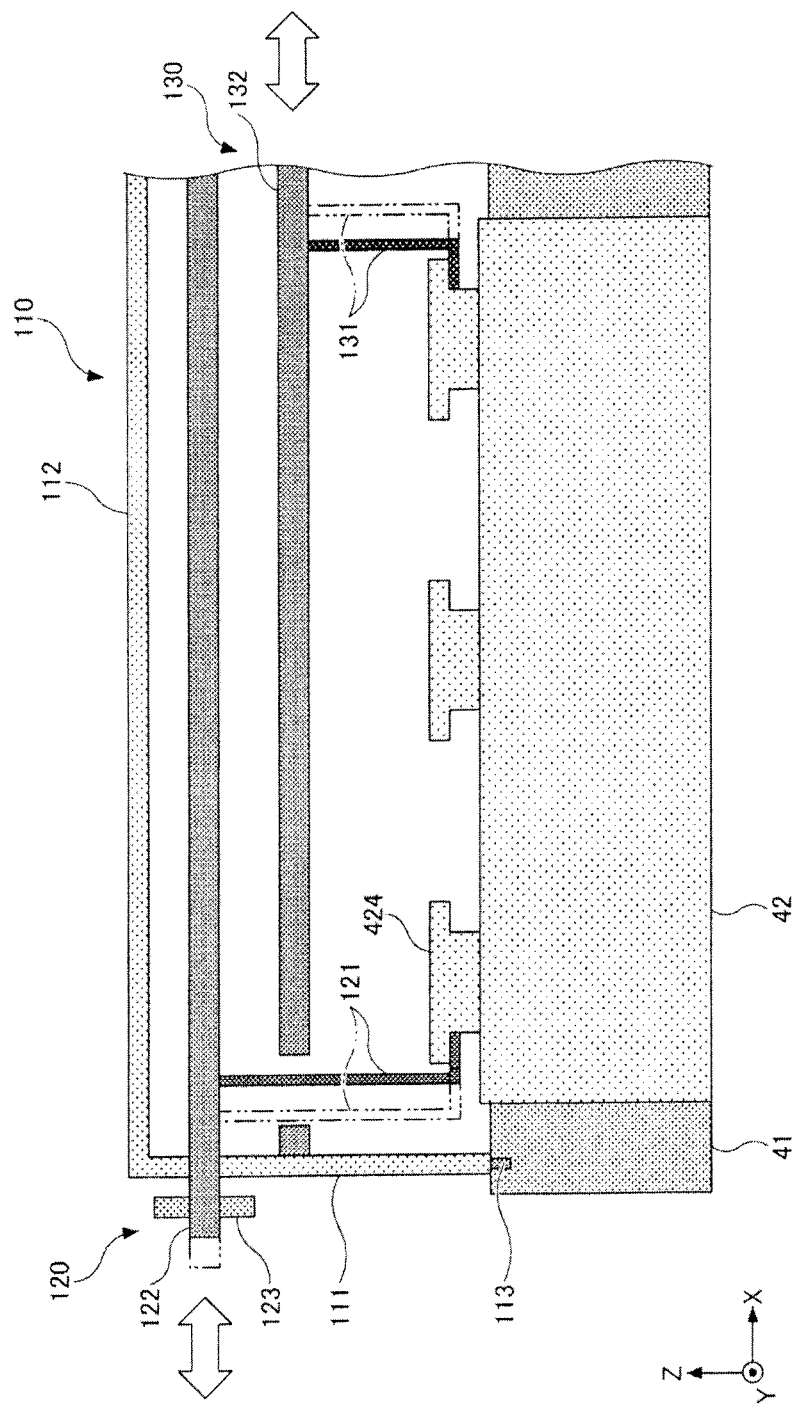
FIG. 9 explains an operation of the insertion/extraction mechanism of FIG. 7 according to one embodiment.

Hereinafter, an example of an insertion/extraction mechanism for inserting/extracting the pogo block 42 into/from the pogo frame 41 constituting the intermediate connection member 40 will be described. FIG. 7 is a plan view showing an example of the insertion/extraction mechanism. FIG. 8 is a cross-sectional view of the insertion/extraction mechanism of FIG. 7 which is taken along a dashed-dotted line VIII-VIII in FIG. 7. FIG. 9 explains the operation of the insertion/extraction mechanism of FIG. 7.

As shown in FIGS. 7 and 8, the insertion/extraction mechanism 100 includes a housing 110, a first engaging unit 120, and a second engaging unit 130.

The housing 110 supports the first engaging unit 120 and the second engaging unit 130 to be movable rectilinearly in a horizontal direction. The housing 110 is formed in, e.g., a substantially box shape that opens downward, and has a size that allows a region on the upper surface of the pogo frame 41 where the insertion holes 43 are formed to be surrounded by the housing 110. The housing 110 includes a sidewall 111, a ceiling portion 112, and the positioning pins 113. In FIG. 7, the ceiling portion 112 of the housing 110 is omitted for convenience of explanation.

The sidewall 111 supports the first engaging unit 120 and the second engaging unit 130 to be movable rectilinearly in the horizontal direction, e.g., in directions parallel to each other (the X direction in FIGS. 7 and 8).

The ceiling portion 112 is disposed at the upper end of the sidewall 111 to cover the first engaging pins 121 and the second engaging pins 131 to be described later.

The positioning pins 113 are disposed at the lower end of the sidewall 111 to correspond to the positioning holes 44 of the pogo frame 41. The positioning pins 113 are inserted into the positioning holes 44 when the housing 110 is installed on the pogo frame 41. Accordingly, the insertion/extraction mechanism 100 (the housing 110) is positioned with respect to the pogo frame 41.

The first engaging unit 120 can be engaged with the pin locking portions 424 of the pogo block 42. The first engaging unit 120 has the first engaging pins 121, a first slide member 122, and a first support member 123.

The first engaging pin 121 has an L-shape that extends downward from the first slide member 122 and is bent at the lower end in its moving direction. The first engaging pin 121 can be engaged with the pin locking portion 424 of the pogo block 42. As shown in FIG. 9, the first engaging pin 121 is moved at least between a position where it is engaged with the pin locking portion 424 and a position where it is not engaged with the pin locking portion 424. In FIG. 9, the position where the first engaging pin 121 is engaged with the pin locking portion 424 is indicated by a solid line, and the position where the first engaging pin 121 is not engaged with the pin locking portion 424 is indicated by a dashed double-dotted line. The lower end of the first engaging pin 121 is located above the lower end of the sidewall 111 of the housing 110. Therefore, it is possible to prevent the first engaging pin 121 from being in contact with the upper surface of the pogo block 42 and contaminating the connection terminals 422 and the like when the insertion/extraction mechanism 100 is installed on the pogo frame 41. The number of the first engaging pins 121 is determined based on the number of insertion holes 43 of the pogo frame 41, i.e., the number of the pogo blocks 42 to be inserted into the pogo frame 41.

The first slide member 122 has a rectangular plate shape, and is supported to be movable rectilinearly in the horizontal direction with respect to the housing 110, e.g., in the direction in which the lower end of the first engaging pin 121 is bent. The first slide member 122 holds one or multiple first engaging pins 121. FIG. 8 shows a case where four first engaging pins 121 are held by the first slide member 122.

The first support member 123 has a rectangular plate shape having long sides orthogonal to the long sides of the first slide member 122. The first support member 123 supports one or multiple first slide members 122 to be movable rectilinearly in the horizontal direction, e.g., in the direction in which one or multiple first slide members 122 move with respect to the housing 110. When the first support member 123 supports multiple first slide members 122, it is preferable that each of the first slide members 122 can independently move rectilinearly with respect to the first support member 123. Accordingly, the pogo blocks 42 inserted into the insertion holes 43 of the pogo frame 41 can be selected and separated on a row basis. For example, in the case of separating pogo blocks 42 in one row among the pogo blocks 42 inserted into the insertion holes 43 of the pogo frame 41, only the pogo blocks 42 in the corresponding one row can be selected and separated without separating all the pogo blocks 42.

The second engaging unit 130 can be engaged with the pin locking portions 424 of the pogo block 42. The second engaging unit 130 includes the second engaging pins 131, a second slide member 132, and a second support member 133.

The second engaging pin 131 has an L-shape that extends downward from the second slide member 132 and is bent at the lower end in its moving direction. The second engaging pin 131 can be engaged with the pin locking portion 424 of the pogo block 42. As shown in FIG. 9, the second engaging pin 131 is moved at least between a position where it is engaged with the pin locking portion 424 and a position where it is not engaged with the pin locking portion 424. In FIG. 9, the position where the second engaging pin 131 is engaged with the pin locking portion 424 is indicated by a solid line, and the position where the second engaging pin 131 is not engaged with the pin locking portion 424 is indicated by a dashed double-dotted line. The lower end of the second engaging pin 131 is located above the lower end of the sidewall 111 of the housing 110. Therefore, it is possible to prevent the second engaging pin 131 from being in contact with the upper surface of the pogo block 42 and contaminating the connection terminals 422 and the like when the insertion/extraction mechanism 100 is installed on the pogo frame 41. The number of the second engaging pins 131 is determined based on the number of insertion holes 43 of the pogo frame 41, i.e., the number of the pogo blocks 42 to be inserted into the pogo frame 41.

The second slide member 132 has a rectangular plate shape, and is supported to be movable rectilinearly in the horizontal direction with respect to the housing 110, e.g., in the direction in which the lower end of the second engaging pin 131 is bent. The second slide member 132 is disposed at a portion of the sidewall 111 of the housing 110 which is opposite to a portion where the first slide member 122 is disposed. The second slide member 132 holds one or multiple second engaging pins 131. FIG. 8 shows a case where four second engaging pins 131 are held by the second slide member 132.

The second support member 133 has a rectangular plate shape having long sides orthogonal to the long sides of the second slide member 132. The second support member 133 supports one or multiple second slide members 132 to be movable rectilinearly in the horizontal direction, e.g., in the direction in which one or multiple second slide members 132 move with respect to the housing 110. When the second support member 133 supports multiple second slide members 132, it is preferable that each of the second slide members 132 can independently move rectilinearly with respect to the second support member 133. Accordingly, the pogo blocks 42 inserted into the insertion holes 43 of the pogo frame 41 can be selected and separated on a row basis. For example, in the case of separating pogo blocks 42 in one row among the pogo blocks 42 inserted into the insertion holes 43 of the pogo frame 41, only the pogo blocks 42 in said one row can be selected and separated without separating all the pogo blocks 42.

Figure 10:
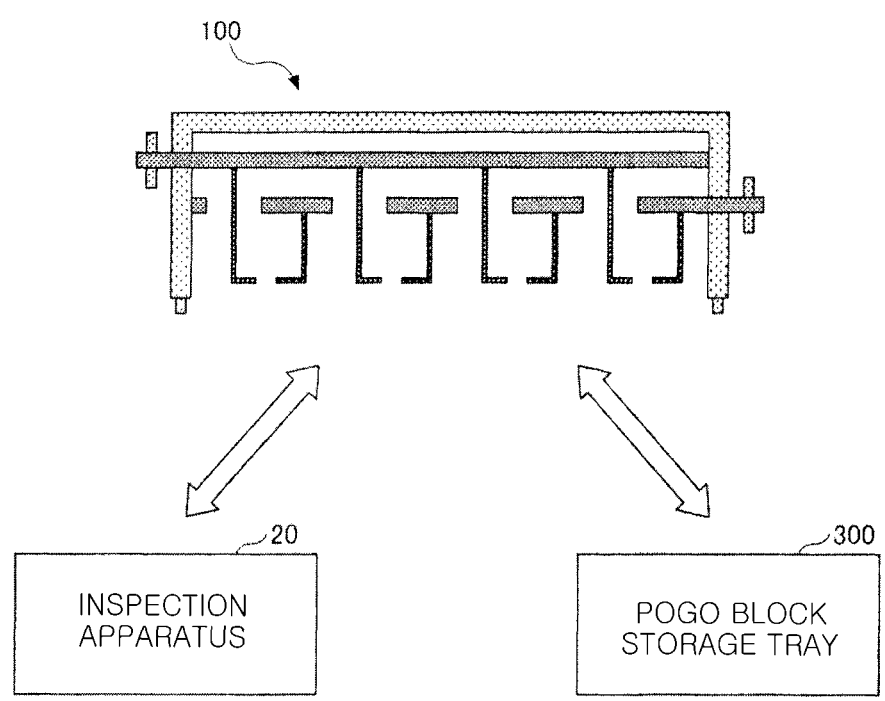
FIG. 10 explains an example of a method for replacing a pogo block according to one embodiment.

A method for replacing the pogo blocks 42 by inserting/extracting the pogo blocks 42 into/from the pogo frame 41 using the above-described insertion/extraction mechanism 100 will be described with reference to FIGS. 9 and 10. Hereinafter, a case of replacing all the pogo blocks 42 inserted into the insertion holes 43 of the pogo frame 41 will be described as an example. FIG. 10 explains an example of the method for replacing the pogo blocks 42.

First, the insertion/extraction mechanism 100 that has moved the first engaging pins 121 and the second engaging pins 131 to the position where they are not engaged with the pin locking portions 424 (the position indicated by the dashed double-dotted line in FIG. 9) is installed on the pogo frame 41 of the intermediate connection member 40 in the inspection apparatus 20. At this time, the insertion/extraction mechanism 100 is installed on the pogo frame 41 such that the positioning pins 113 of the insertion/extraction mechanism 100 are inserted into the positioning holes 44 of the pogo frame 41. Accordingly, the first engaging unit 120 and the second engaging unit 130 of the insertion/extraction mechanism 100 and the pin locking portions 424 of the pogo block 42 are positioned. The lower ends of the first engaging pin 121 and the second engaging pin 131 are located above the lower end of the sidewall 111 of the housing 110. Therefore, it is possible to prevent the first engaging pins 121 and the second engaging pins 131 from being in contact with the upper surface of the pogo block 42 and contaminating the connection terminals 422 and the like when the insertion/extraction mechanism 100 is installed on the pogo frame 41.

Then, the first engaging pin 121 is moved to the position (indicated by the solid line in FIG. 9) where it is engaged with the pin locking portion 424 by moving at least one of the first slide member 122 and the first support member 123 with respect to the housing 110. Accordingly, the first engaging pin 121 is engaged with the pin locking portion 424. In addition, the second engaging pin 131 is moved to the position (indicated by the solid line in FIG. 9) where it is engaged with the pin locking portion 424 by moving at least one of the second slide member 132 and the second support member 133 with respect to the housing 110. Accordingly, the second engaging pin 131 is engaged with the pin locking portion 424.

Then, the insertion/extraction mechanism 100 is moved upward to be separated from the pogo frame 41. At this time, since the first engaging pins 121 and the second engaging pins 131 are engaged with the pin locking portions 424, the pogo blocks 42 are held by the insertion/extraction mechanism 100 and separated from the insertion holes 43 of the pogo frame 41.

Next, the insertion/extraction mechanism 100 holding the pogo blocks 42 is installed on a pogo block storage tray 300. The pogo block storage tray 300 has the same configuration as that of the pogo frame 41, and has insertion holes (not shown) arranged in the same manner as those in the pogo frame 41.

Then, the first engaging pin 121 is moved to the position where it is not engaged with the pin locking portion 424 by moving at least one of the first slide member 122 and the first support member 123 with respect to the housing 110. Further, the second engaging pin 131 is moved to the position where it is not engaged with the pin locking portion 424 by moving at least one of the second slide member 132 and the second support member 133 with respect to the housing 110. Accordingly, the pogo blocks 42 are inserted into the insertion holes of the pogo block storage tray 300.

Then, the insertion/extraction mechanism 100 is moved upward to be separated from the pogo block storage tray 300. At this time, since the first engaging pins 121 and the second engaging pins 131 are not engaged with the pin locking portions 424, the pogo blocks 42 are not held by the insertion/extraction mechanism 100.

In this manner, the separation of the pogo blocks 42 from the pogo frame 41 is completed.

Then, the insertion/extraction mechanism 100 is installed on the pogo block storage tray 300 where new pogo blocks 42 to be attached to the pogo frame 41 are stored.

Next, the insertion/extraction mechanism 100 is driven in the same manner as that in the case of separating the pogo blocks 42 from the pogo frame 41 to separate the pogo blocks 42 from the pogo block storage tray 300 and hold the pogo blocks 42.

Thereafter, the insertion/extraction mechanism 100 holding the pogo block 42 is installed on the pogo frame 41 from which the pogo blocks 42 have been separated.

Next, the insertion/extraction mechanism 100 is driven in the same manner as that in the case of inserting the pogo blocks 42 into the pogo block storage tray 300 to insert the pogo blocks 42 into the insertion holes 43 of the pogo frame 41.

In the above-described manner, all the pogo blocks 42 inserted into the insertion holes 43 of the pogo frame 41 are replaced with new pogo blocks 42.

In the case of replacing some of the pogo blocks 42, it is preferable to move the first slide member 122 and the second slide member 132 located at the positions corresponding to the pogo blocks 42 to be replaced when the first engaging pins 121 and the second engaging pins 131 are engaged with the pin locking portions 424.

As described above, the insertion/extraction mechanism 100 includes the first engaging unit 120 and the second engaging unit 130 that are movable between the position where they are engaged with the pin locking portions 424 and the position where they are not engaged with the pin locking portions 424. The pogo blocks 42 are held by engaging the first engaging unit 120 and the second engaging unit 130 with the pin locking portions 424. Accordingly, the pogo blocks can be attached or detached within a short period of time without contaminating the connection terminals 422.

Figure 11:
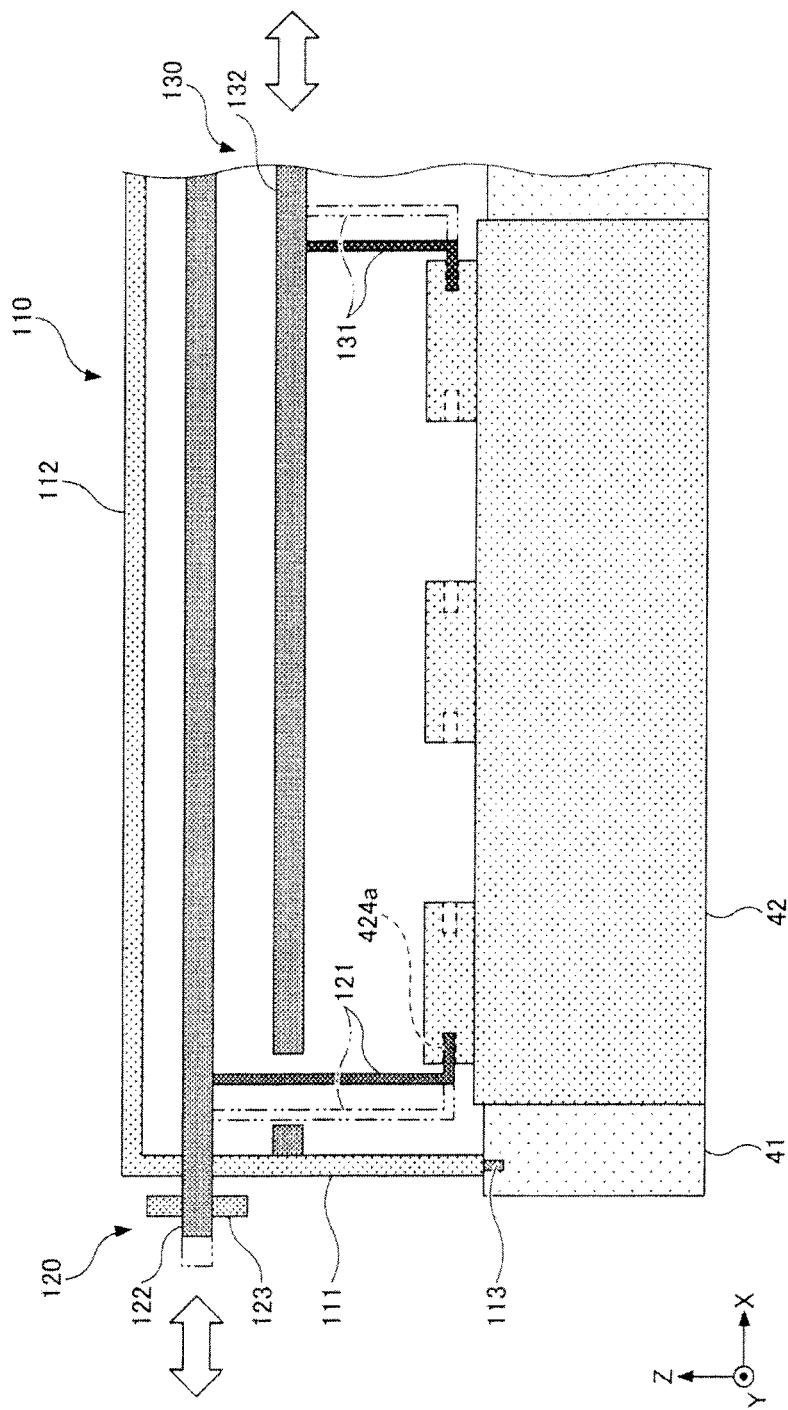
FIG. 11 is a cross-sectional view showing another example of a pogo block according to one embodiment.

The above example has described the case where the pogo block 42 has the pin locking portion 424 to be engaged with the first engaging pins 121 and the second engaging pins 131. However, the present disclosure is not limited thereto. For example, as shown in FIG. 11, the pogo block 42 may have pin engaging holes 424a instead of the pin locking portions 424.

Figure 12:
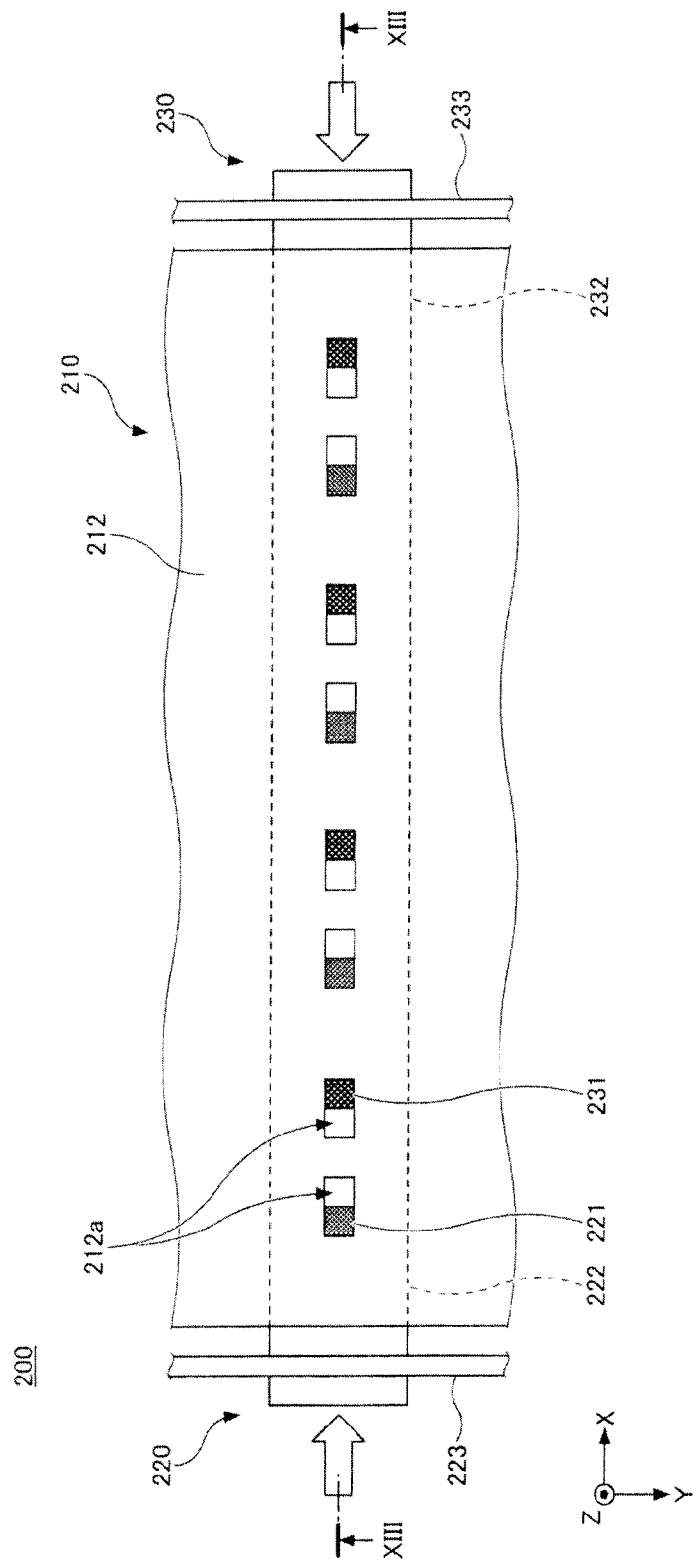
FIG. 12 is a plan view showing another example of the insertion/extraction mechanism according to one embodiment.
Figure 13:
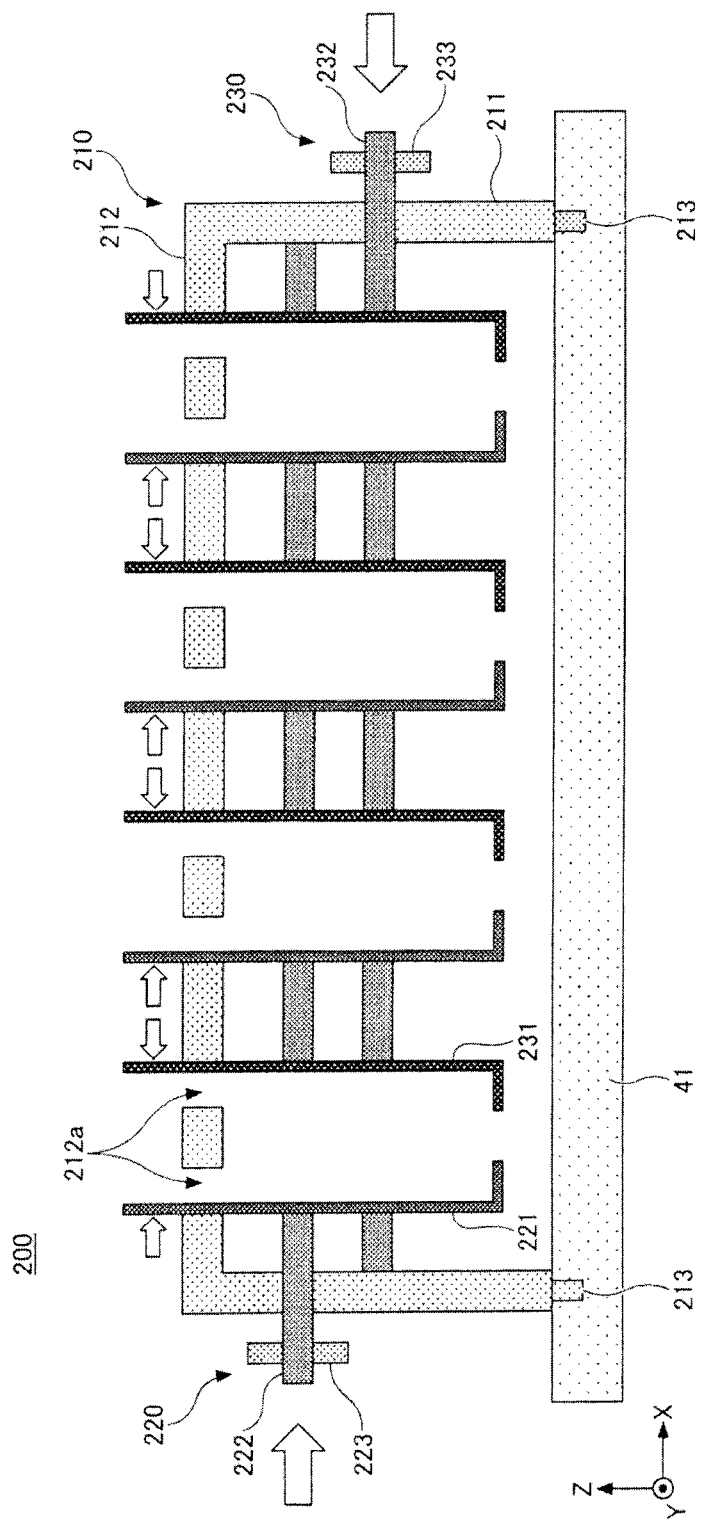
FIG. 13 is a cross-sectional view of the insertion/extraction mechanism according to one embodiment.

Next, another example of an insertion/extraction mechanism for inserting/extracting the pogo blocks 42 into/from the pogo frame 41 constituting the intermediate connection member 40 will be described. FIG. 12 is a plan view showing another example of the insertion/extraction mechanism and illustrates the first slide member 222 and the second slide member 232 in one row among multiple rows. FIG. 13 is a cross-sectional view of the insertion/extraction mechanism of FIG. 12 which is taken along a dashed-dotted line XIII-XIII in FIG. 12. FIGS. 12 and 13 show a state in which all the first engaging pins 221 and the second engaging pins 231 are not engaged with the pin locking portions 424.

The insertion/extraction mechanism 200 shown in FIGS. 12 and 13 includes a housing 210, a first engaging unit 220, and a second engaging unit 230.

The housing 210 supports the first engaging unit 220 and the second engaging unit 230 to be movable rectilinearly in the horizontal direction. The housing 210 is formed in, e.g., a substantially box shape that opens downward, and has a size that allows a region on the upper surface of the pogo frame 41 where the insertion holes 43 are formed to be surrounded by the housing 210. The housing 210 includes a sidewall 211, a ceiling portion 212, and positioning pins 213.

The sidewall 211 supports the first engaging unit 220 and the second engaging unit 230 to be movable rectilinearly in the horizontal direction, e.g., in directions parallel to each other (the X direction in FIGS. 12 and 13).

The ceiling portion 212 is disposed at the upper end of the sidewall 211 to cover the first engaging pins 221 and the second engaging pins 231 to be described later. Guide holes 212a for guiding the first engaging pins 221 and the second engaging pint 231 to be described later are formed at the ceiling portion 212.

The positioning pins 213 are disposed at the lower end of the sidewall 211 to correspond to the positioning holes 44 of the pogo frame 41. The positioning pins 213 are inserted into the positioning holes 44 when the housing 210 is installed on the pogo frame 41. Accordingly, the insertion/extraction mechanism 200 (the housing 210) is positioned with respect to the pogo frame 41.

The first engaging unit 220 can be engaged with the pin locking portions 424 of the pogo block 42. The first engaging unit 220 has the first engaging pins 221, a first slide member 222, and a first support member 223.

The first engaging pin 221 has an L-shape that extends from a position above the ceiling portion 212 of the housing 210 through the guide hole 212a to a position below the first slide member 222 and is bent at the lower end in its moving direction. The first engaging pin 221 can be engaged with the pin locking portion 424 of the pogo block 42 and is moved while being guided by the guide hole 212a at least between a position where it is engaged with the pin locking portion 424 and a position where it is not engaged with the pin locking portion 424. When the first engaging pin 221 is located at a certain position among the position where it is engaged with the pin locking portion 424 and the position where it is not engaged with the pin locking portion 424, it is preferable to fix the first engaging pin 221 using a locking mechanism (not shown) to prevent the movement thereof. The lower end of the first engaging pin 221 is located above the lower end of the sidewall 211 of the housing 210. Therefore, it is possible to prevent the first engaging pin 221 from being in contact with the upper surface of the pogo block 42 and contaminating the connection terminals 422 and the like when the insertion/extraction mechanism 200 is installed on the pogo frame 41.

The number of the first engaging pins 221 is determined based on the number of the insertion holes 43 of the pogo frame 41, i.e., the number of the pogo blocks 42 to be inserted into the pogo frame 41. When there are multiple first engaging pins 221, it is preferable that each of the first engaging pins 221 can move independently while being guided by the guide hole 212a. Accordingly, the pogo blocks 42 inserted into the insertion holes 43 of the pogo frame 41 can be selected and separated one by one. For example, in the case of separating one of the pogo blocks 42 inserted into the insertion holes 43 of the pogo frame 41, only one pogo block 42 can be selected and separated without separating all the pogo blocks 42.

The first slide member 222 has a rectangular plate shape and is supported to be movable rectilinearly in the horizontal direction with respect to the housing 210, e.g., in the direction in which the lower end of the first engaging pin 221 is bent. The first slide member 222 moves the first engaging pins 221 arranged in the same row simultaneously while being in contact therewith.

The first support member 223 has a rectangular plate shape having long sides orthogonal to the long sides of the first slide member 222. The first support member 223 supports one or multiple first slide members 222 to be movable rectilinearly in the horizontal direction, e.g., in the direction in which one or multiple first slide members 222 move with respect to the housing 210. When the first support member 223 supports multiple first slide members 222, it is preferable that each of the first slide members 222 can independently move rectilinearly with respect to the first support member 223. Accordingly, the pogo blocks 42 inserted into the insertion holes 43 of the pogo frame 41 can be selected and separated on a row basis. For example, in the case of separating pogo blocks 42 in one row among the pogo blocks 42 inserted into the insertion holes 43 of the pogo frame 41, only the pogo blocks 42 in said one row can be selected and separated without separating all the pogo blocks 42.

The second engaging unit 230 can be engaged with the pin locking portions 424 of the pogo block 42. The second engaging unit 230 includes the second engaging pins 231, a second slide member 232, and a second support member 233.

The second engaging pin 231 has an L-shape that extends from a position above the ceiling portion 212 of the housing 210 through the guide hole 212a to a position below the first slide member 222 and is bent at the lower end in its moving direction. The second engaging pin 231 can be engaged with the pin locking portion 424 of the pogo block 42 and is moved while being guided by the guide hole 212a at least between a position where it is engaged with the pin locking portion 424 and a position where it is not engaged with the pin locking portion 424. When the second engaging pin 231 is located at a certain position among the position where it is engaged with the pin locking portion 424 and the position where it is not engaged with the pin locking portion 424, it is preferable to fix the second engaging pin 231 using a locking mechanism (not shown) to prevent the movement thereof. The lower end of the second engaging pin 231 is located above the lower end of the sidewall 211 of the housing 210. Therefore, it is possible to prevent the second engaging pin 231 from being in contact with the upper surface of the pogo block 42 and contaminating the connection terminals 422 and the like when the insertion/extraction mechanism 200 is installed on the pogo frame 41.

The number of the second engaging pins 231 is determined based on the number of the insertion holes 43 of the pogo frame 41, i.e., the number of the pogo blocks 42 to be inserted into the pogo frame 41. When there are multiple second engaging pins 231, it is preferable that each of the second engaging pins 231 can move independently while being guided by the guide hole 212a. Accordingly, the pogo blocks 42 inserted into the insertion holes 43 of the pogo frame 41 can be selected and separated one by one. For example, in the case of separating one of the pogo blocks 42 inserted into the insertion holes 43 of the pogo frame 41, only one pogo block 42 can be selected and separated without separating all the pogo blocks 42.

The second slide member 232 has a rectangular plate shape and is supported to be movable rectilinearly in the horizontal direction with respect to the housing 210, e.g., in the direction in which the lower end of the second engaging pin 231 is bent. The second slide member 222 moves the second engaging pins 231 arranged in the same row simultaneously while being in contact therewith.

The second support member 233 has a rectangular plate shape having long sides orthogonal to the long sides of the second slide member 232. The second support member 233 supports one or multiple second slide members 232 to be movable rectilinearly in the horizontal direction, e.g., in the direction in which one or multiple second slide members 232 move with respect to the housing 210. When the second support member 233 supports multiple second slide members 232, it is preferable that each of the second slide members 232 can independently move rectilinearly with respect to the second support member 233. Accordingly, the pogo blocks 42 inserted into the insertion holes 43 of the pogo frame 41 can be selected and separated on a row basis. For example, in the case of separating pogo blocks in one row 42 among the pogo blocks 42 inserted into the insertion holes 43 of the pogo frame 41, only the pogo blocks 42 in said one row can be selected and separated without separating all the pogo blocks 42.

As described above, the insertion/extraction mechanism 200 can rectilinearly move the first engaging pins 221 and the second engaging pins 231 on a row basis or one by one. Accordingly, the pogo blocks 42 inserted into the insertion holes 43 of the pogo frame 41 can be selected and separated on a row basis or one by one.

In the above-described embodiment, the tester motherboard 31 is an example of the first member, and the terminals of the tester motherboard 31 are examples of the first terminal. The probe card 50 is an example of the second member, and the terminals of the base 51 are examples of the second terminal. The pogo frame 41 is an example of a frame member, and the pogo block 42 is an example of a block member. The pin locking portion 424 and the pin engaging hole 424a are examples of a first engaged portion and a second engaged portion.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

In the above-described embodiment, the inspection apparatus 20 in the inspection system 10 having a plurality of inspection chambers 11 has been described as an example. However, the present disclosure is not limited thereto, and may be applied to a single inspection apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. An insertion/extraction mechanism for inserting one or multiple block members into a frame member or extracting the one or multiple block members from the frame member, & the frame member forming an intermediate connection member that is disposed between a first member having multiple first terminals and a second member having multiple second terminals and electrically connects the first terminals and the second terminals, the one or multiple block members having multiple connection terminals for electrically connecting the multiple first terminals and the multiple second terminals, the insertion/extraction mechanism comprising:
   a first engaging unit that is engageable with a first engaged portion of the block member and is movable at least between a position where the first engaging unit is engaged with the first engaged portion and a position where the first engaging unit is not engaged with the first engaged portion; and
   a second engaging unit that is engageable with a second engaged portion of the block member and is movable at least between a position where the second engaging unit is engaged with the second engaged portion and a position where the second engaging unit is not engaged with the second engaged portion,
   wherein the first engaging unit and the second engaging unit are engaged with the first engaged portion and the second engaged portion, respectively, thereby holding the block member.

2. The insertion/extraction mechanism of claim 1, wherein the first engaging unit and the second engaging unit rectilinearly move in parallel with each other.

3. The insertion/extraction mechanism of claim 2, further comprising:
   a housing that supports the first engaging unit and the second engaging unit to be movable rectilinearly in a horizontal direction.

4. The insertion/extraction mechanism of claim 3, wherein the first engaging unit includes a first engaging pin that is engageable with the first engaged portion, a first slide member configured to move rectilinearly the first engaging pin with respect to the housing, and a first support member configured to support the first slide member to be movable rectilinearly, and
   the second engaging unit includes a second engaging pin that is engageable with the second engaged portion, a second slide member configured to move rectilinearly the second engaging pin with respect to the housing, and a second support member configured to support the second slide member to be movable rectilinearly.

5. The insertion/extraction mechanism of claim 4, wherein the first engaging pin and the second engaging pin extend downward from the first slide member and the second slide member, respectively, and lower ends thereof are bent in moving directions of the first engaging pin and the second engaging pin, respectively.

6. The insertion/extraction mechanism of claim 5, wherein the lower ends of the first engaging pin and the second engaging pin are located above a lower end of the housing.

7. The insertion/extraction mechanism of claim 4, wherein the first engaging pin and the second engaging pin are fixed to the first slide member and the second slide member, respectively.

8. The insertion/extraction mechanism of claim 4, wherein the first engaging pin and the second engaging pin are movable rectilinearly in a horizontal direction with respect to the first slide member and the second slide member, respectively.

9. The insertion/extraction mechanism of claim 3, wherein the housing has positioning pins that are insertable into positioning holes formed at the frame member.

10. The insertion/extraction mechanism of claim 1, further comprising:
a housing that supports the first engaging unit and the second engaging unit to be movable rectilinearly in a horizontal direction.

11. The insertion/extraction mechanism of claim 10, wherein the first engaging unit includes a first engaging pin that is engageable with the first engaged portion, a first slide member configured to move rectilinearly the first engaging pin with respect to the housing, and a first support member configured to support the first slide member to be movable rectilinearly, and
the second engaging unit includes a second engaging pin that is engageable with the second engaged portion, a second slide member configured to move rectilinearly the second engaging pin with respect to the housing, and a second support member configured to support the second slide member to be movable rectilinearly.

12. The insertion/extraction mechanism of claim 11, wherein the first engaging pin and the second engaging pin extend downward from the first slide member and the second slide member, respectively, and lower ends thereof are bent in moving directions of the first engaging pin and the second engaging pin, respectively.

13. The insertion/extraction mechanism of claim 12, wherein the lower ends of the first engaging pin and the second engaging pin are located above a lower end of the housing.

14. The insertion/extraction mechanism of claim 11, wherein the first engaging pin and the second engaging pin are fixed to the first slide member and the second slide member, respectively.

15. The insertion/extraction mechanism of claim 11, wherein the first engaging pin and the second engaging pin are movable rectilinearly in a horizontal direction with respect to the first slide member and the second slide member, respectively.

16. The insertion/extraction mechanism of claim 10, wherein the housing has positioning pins that are insertable into positioning holes formed at the frame member.

17. A method for replacing a block member to be inserted into or extracted from a frame member forming an intermediate connection member that is disposed between a first member having multiple first terminals and a second member having multiple second terminals to electrically connect the first terminals and the second terminals, the block member having multiple connection terminals for electrically connecting the multiple first terminals and the multiple second terminals, the method comprising:
moving a first engaging unit that is engageable with a first engaged portion of the block member from a position where the first engaging unit is not engaged with the first engaged portion to a position where the first engaging unit is engaged with the first engaged portion;
moving a second engaging unit that is engageable with a second engaged portion of the block member from a position where the second engaging unit is not engaged with the second engaged portion to a position where the second engaging unit is engaged with the second engaged portion; and
separating the block member from the frame member and transferring the block member in a state where the first engaging unit and the second engaging unit are engaged with the first engaged portion and the second engaged portion, respectively.

\* \* \* \* \*